United States Patent
Chandrasekaran

(10) Patent No.: US 7,900,519 B2
(45) Date of Patent: Mar. 8, 2011

(54) MICROFLUIDIC MEASURING TOOL TO MEASURE THROUGH-SILICON VIA DEPTH

(75) Inventor: Arvind Chandrasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 91 days.

(21) Appl. No.: 12/482,539

(22) Filed: Jun. 11, 2009

(65) Prior Publication Data
US 2010/0313652 A1 Dec. 16, 2010

(51) Int. Cl.
*G01L 9/00* (2006.01)
(52) U.S. Cl. .............................. 73/754; 257/48
(58) Field of Classification Search .......... None
See application file for complete search history.

(56) References Cited

U.S. PATENT DOCUMENTS

| 6,993,966 | B2 | 2/2006 | Stenmark |
| 2003/0061890 | A1 | 4/2003 | Chen |
| 2005/0199078 | A1 | 9/2005 | Temmler |
| 2007/0007429 | A1 | 1/2007 | Fairley |
| 2007/0293052 | A1* | 12/2007 | Le Roy et al. ............ 438/708 |
| 2009/0200547 | A1* | 8/2009 | Griffin et al. ............. 257/48 |
| 2010/0263793 | A1* | 10/2010 | Ylitalo et al. ............ 156/344 |

FOREIGN PATENT DOCUMENTS

JP 61025005 2/1986

OTHER PUBLICATIONS

International Search Report-PCT/ US2010/038371, International Search Authority-European Patent Office Oct. 15, 2010.
Written Opinion-PCT/ US2010/038371, International Search Authority-European Patent Office Oct. 15, 2010.

* cited by examiner

*Primary Examiner* — Andre J Allen
(74) *Attorney, Agent, or Firm* — Michelle Gallardo; Nicholas J. Pauley; Jonathan T. Velasco

(57) ABSTRACT

A tool to measure the depth of one or more through-silicon vias, the tool fabricated in silicon to include a microfluidic chamber that is positioned over the one or more through-silicon vias, further including a fluid actuation chamber to inject fluid into the microfluidic chamber and into the one or more through-silicon vias, and a pressure sensing chamber to sense the fluid pressure to indicate when the one or more through-silicon vias are filled with the fluid.

16 Claims, 4 Drawing Sheets

MICROFLUIDIC MEASURING TOOL TO MEASURE THROUGH-SILICON VIA DEPTH

FIELD

The present invention relates to metrology, and more particularly, to measuring the depth of vias in a die.

BACKGROUND

A through-silicon via is a vertical electrical connection passing completely through a silicon die or wafer. A through-silicon via in a die connects a component or pad on the active side of the die to a pad or component on the other side of the die. In one application, two or more dice having integrated circuits may be stacked vertically, where through-silicon vias electrically connect the integrated circuits. This application is referred to as 3D packaging, or chip stacking.

During fabrication of through-silicon vias in a wafer, the depth of the through-silicon vias should be tightly controlled to ensure the reliability of subsequent processes. However, through-silicon vias tend to have a relatively high aspect ratio, which contributes to the difficulty in measuring via depth. For example, a through-silicon via may have a diameter of 6 μm and a depth of 50 μm. Optical measurement technology, such as for example confocal microscopy, has been used to measure through-silicon vias depth, but such measurements are susceptible to noise.

Current technology for measuring the depth of through-silicon vias may not produce sufficiently reliable measurements, and may suffer from slow throughput. A tool for accurately measuring the depth of through-silicon vias with relatively high throughput would be desirable.

SUMMARY

According to an embodiment, formed in a substrate are a microfluidic chamber, a fluid actuation chamber, and a pressure sensing chamber. The microfluidic chamber has a first opening, a second opening, and a third opening. The fluid actuation chamber is coupled to the second opening to inject fluid into the microfluidic chamber. The pressure sensing chamber is coupled to the third opening to sense fluid pressure.

According to another embodiment, a tool comprises a substrate. The substrate comprises a microfluidic chamber having an opening; a fluid actuation chamber coupled to the microfluidic chamber to inject fluid into the microfluidic chamber; and a pressure sensing chamber coupled to the microfluidic chamber to sense fluid pressure.

In another embodiment, a method may be used to measure the volume of a fluid injected into one or more vias. The one or more vias are in a wafer. The method includes placing the opening of a microfluidic chamber over the one or more vias. The fluid is injected into the microfluidic chamber and the one or more vias. The pressure of the fluid in the microfluidic chamber is sensed, and the volume of the fluid injected into the microfluidic chamber and the one or more vias is measured when one or more characteristics of the sensed pressure satisfy a criterion.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
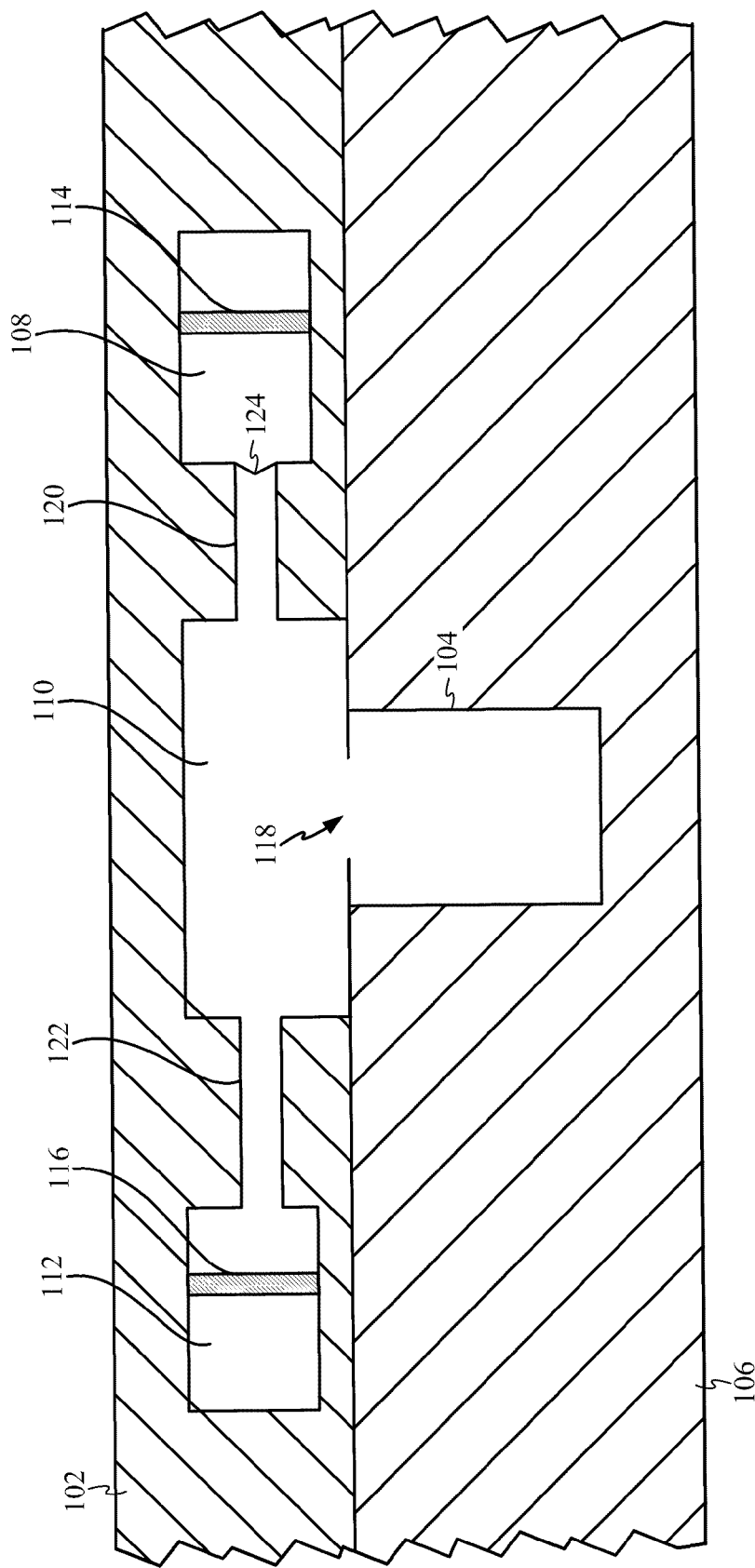
FIG. 1 illustrates a plan view of a cross-section of a microfluidic measuring tool.

FIG. 1 illustrates a microfluidic measuring tool 102 to measure the depth of a through-silicon via 104 in a silicon wafer 106. FIG. 1 illustrates a simplified plan view, not drawn to scale, in which the view is of a slice taken perpendicular to the direction looking into the page of illustration. For ease of illustration, FIG. 1 does not illustrate the entire wafer 106, nor does it necessarily illustrate the entire microfluidic measuring tool 102 because various components of the microfluidic measuring tool 102 may be repeated. In practice, there most likely will be many through-silicon vias in the wafer 106. In FIG. 1, the through-silicon via 104 is not shown going through the entire depth of the wafer 106 because at the time that the microfluidic measuring tool 102 is used, the wafer 106 has not yet been back grinded to expose the through-silicon via 104.

The microfluidic measuring tool 102 comprises a fluid actuation chamber 108, a microfluidic chamber 110, and a pressure sensing chamber 112. The fluid actuation chamber 108 includes a diaphragm 114, and the pressure sensing chamber 112 includes a diaphragm 116. The microfluidic chamber 110 includes an opening 118 so that a fluid filling through-silicon via 104 and microfluidic chamber 110 may come to hydrostatic equilibrium. That is, when in equilibrium, the pressure of the fluid inside the microfluidic chamber 110 is the same as that of the fluid inside through-silicon via 104.

In operation, measurement of the depth of through-silicon via 104 is performed in a vacuum. Fluid actuation chamber 108 contains a fluid. Diaphragm 114 is movable and its position is measurable. To perform a measurement, microfluidic measuring tool 102 is placed over the silicon wafer 106 so that the opening 118 is aligned over the through-silicon via 104. Alignment markers on the wafer 106 may be used for alignment. By moving the diaphragm 114, fluid is forced out of the fluid actuation chamber 108 and into the microfluidic chamber 110 by way of a conduit 120. The interface between the conduit 120 and the fluid actuation chamber 108 may comprise a valve 124, where the valve 124 opens when the measurement process is to be performed so that fluid in the fluid actuation chamber 108 may be forced into the microfluidic chamber 110.

As fluid is forced into the microfluidic chamber 110, fluid also flows into the through-silicon via 104 by way of the opening 118. Eventually, the movement of the diaphragm 114 causes fluid to fill the microfluidic chamber 110 and the through-silicon via 104, and the fluid then enters conduit 122 and into the pressure sensing chamber 112. As the diaphragm 114 continues to move, the pressure in the fluid builds up, and the fluid exerts a pressure on the diaphragm 116.

The fluid may be chosen to have little compressibility, such as for example water, in which case the pressure on the diaphragm 116 rises from a zero value to some positive value when the fluid completely fills the microfluidic chamber 110, the through-silicon via 104, the conduits 120 and 122, and the portion of the pressure sensing chamber 112 to the right of the diaphragm 116. This rise in the sensed pressure may happen over relatively short period of time. It may be measured by comparing the pressure on the diaphragm 116 to the positive value, or by measuring the time derivative of the pressure on the diaphragm 116 and comparing that derivative to some threshold value. For some embodiments, the positive value, or the threshold value, may be computed before the measurement process begins.

When the pressure on the diaphragm 116 indicates that the through-silicon via 104 is completely filled with fluid, the position of the diaphragm 114 is measured so that the distance covered by the diaphragm 114 during the measurement process may be calculated. The volume of the through-silicon via 114 may be calculated based upon the distance covered by the diaphragm 114, and knowledge of the area of the diaphragm 114, as well as knowledge of the geometries of the conduits 120 and 122, the microfluidic chamber 110, the fluid actuation chamber 108, and the pressure sensing chamber 112. A typical volume for a through-silicon via may be in the neighborhood of 1.4 picoliters, which is approximately the volume of a cylinder with a radius of 3 μm and a height of 50 μm.

The position of the pressure sensing diaphragm 116 should be measured because of the contribution of the pressure sensing chamber 112 to the total volume of the fluid. The microfluidic measuring tool 102 also should be calibrated so that the initial conditions may be known. For example, some embodiments may activate the valve 124 between the interface of the conduit 120 and the fluid actuation chamber 108 so that initially, before a measurement process begins, the fluid may fill up the fluid actuation chamber 108 to the left of the diaphragm 114 and to the right of the valve 124.

The depth of the through-silicon via 104 can be calculated from its measured volume, provided some assumptions are made about its geometry. For example, the through-silicon via 104 may be modeled as having a shape similar to a cylinder, but with a taper angle, where the through-silicon via 104 is tapered so as to have a larger radius at its top than at its bottom. If the taper angle is denoted as θ, the radius of the top denoted as r, and the height denoted as h, then the volume V is easily calculated as $$V = \pi h r^2 \left(1 - \frac{h\alpha}{r} + \frac{h^2 \alpha^2}{3r^2}\right),$$

where α=tan (θ). Given the volume, standard numerical techniques may be used to calculate the height. Because the volume V is roughly linear in the height variable h, the relative error in height is approximately the same as the relative error in the measurement of volume.

The components for the microfluidic measuring tool 102 illustrated in FIG. 1 may be fabricated into a silicon substrate by standard photolithography techniques known to those in the art of MEMS (Micro-Electro-Mechanical Systems). The substrate may be a wafer. The feature sizes of the various components making up the microfluidic measuring tool 102 may be on the order of microns, or sub-microns.

Figure 2:
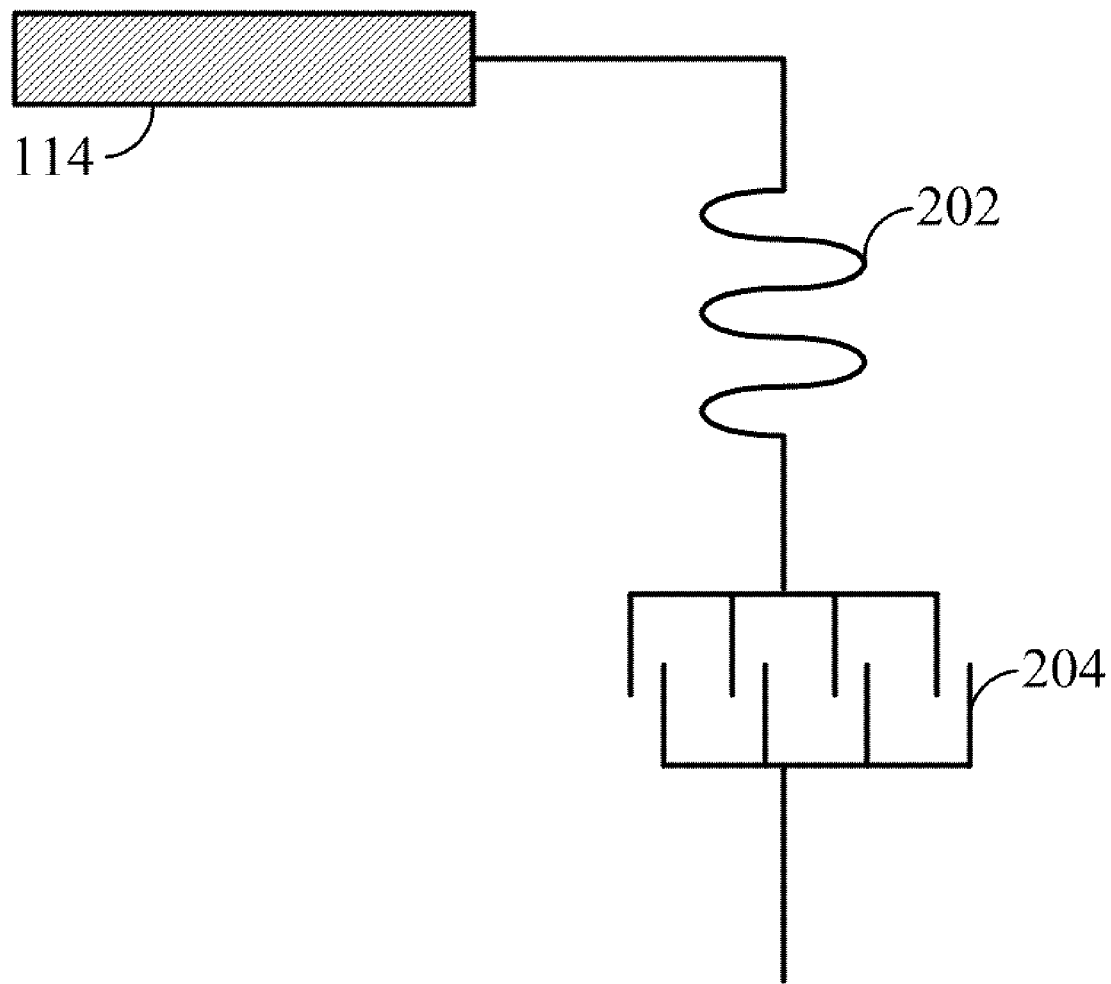
FIG. 2 illustrates a conventional apparatus for measuring the position of a diaphragm.

The movement of the diaphragm 114 may be implemented in any one of a number of known ways. For example, FIG. 2 illustrates in pictorial fashion a conventional way for moving the diaphragm 114. As illustrated in FIG. 2, the diaphragm 114 is connected to a serpentine spring 202 which is connected to a plate of a capacitor 204. The plates of the capacitor 204 comprise interlaced digits. The other plate of the capacitor 204 is secured so as to be stationary with respect to the microfluidic measuring tool 102. Varying the voltage on the two plates of the capacitor 204 changes the separation between the two plates, so that the position of the diaphragm 114 may be varied.

Measuring the capacitance of the capacitor 204 also provides a way of measuring the position of the diaphragm 114. Similarly, the diaphragm 116 used for sensing pressure may also be coupled to a capacitor, where the capacitance of the capacitor provides an indication of the position of the diaphragm 116. To sense pressure, the diaphragm 116 should also be connected to one end of a spring in which the other end of the spring is secured so as to be stationary with respect to the microfluidic measuring tool 102. In this way, by compressing the spring, the position of the diaphragm 116 provides an indication of the pressure of the fluid.

The microfluidic measuring tool 102 also comprises circuits for providing electrical communication to other external circuits or equipment so that the positions of the diaphragms may be determined, and so that the operation of the microfluidic measuring tool 102 may be controlled. Other components, such as pumps, may be integrated in the microfluidic measuring tool 102.

Figure 3:
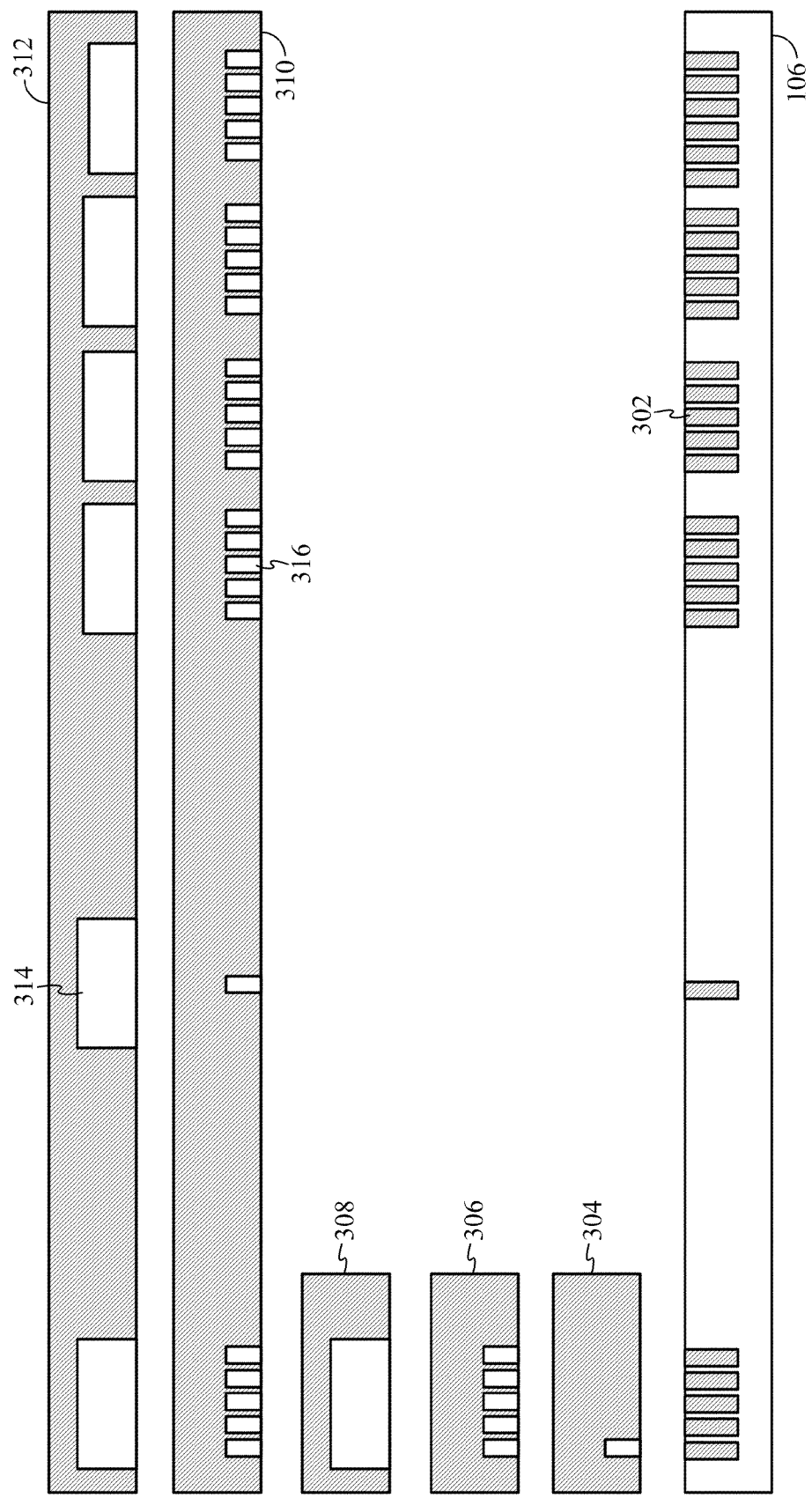
FIG. 3 illustrates several microfluidic measuring tools for measuring one or more through-silicon vias.

Various embodiments of a microfluidic measuring tool may be designed to measure multiple through-silicon vias simultaneously, or one through-silicon via at time. This is illustrated in FIG. 3. The wafer 106 in FIG. 3 has a number of through-silicon vias, each represented by a hatched rectangle, where for example one such through-silicon via is labeled as 302. Illustrated above the wafer 106 are five different types of microfluidic measuring tools, labeled 304, 306, 308, 310, and 312, where the empty rectangles, such as for example rectangles 314 and 316, are the microfluidic chambers. For ease of illustration, the openings in the microfluidic chambers are not shown; and also the fluid actuation chambers, the pressure sensing chambers, and the various conduits for conducting fluid in and out of the microfluidic chambers are not shown.

The microfluidic measuring tool 304 has only a single microfluidic chamber comparable in size to a single through-silicon via. For this type of embodiment, the microfluidic measuring tool 304 takes a volume measurement of only a single through-silicon via at a time, so that the tool must move from one through-silicon via to another to take a series of measurements.

The microfluidic measuring tool 306 has multiple microfluidic chambers so that multiple through-silicon vias may be measured simultaneously. However, these multiple through-silicon vias do not cover the entire wafer 106, so that the microfluidic measuring tool 306 should be moved to different positions on to the wafer 106 to measure all of the through-silicon vias.

The microfluidic measuring tool 308 has a single microfluidic chamber that is large enough to measure multiple through-silicon vias at a single time. For such an embodiment, a measurement is made of the sum of the volumes of the measured through-silicon vias. Dividing this total volume measurement by the number of measured through-silicon vias provides an average volume measurement. This may be sufficiently accurate if the through-silicon vias under measurement have substantially the same volume. However, the single microfluidic chamber illustrated in the microfluidic measuring tool 308 is not large enough to cover the entire wafer 106, so that the tool should be moved to various positions on the wafer 106 to measure all of the through-silicon vias.

The microfluidic measuring tool 310 has a number of microfluidic chambers, each one matched in size to a through-silicon via, and each one having a relative position that matches the positions of the through-silicon vias in the wafer 106. Accordingly, the microfluidic measuring tool 310 can take measurements of all the through-silicon vias simultaneously.

The microfluidic measuring tool 312 has multiple microfluidic chambers, but each one is larger than any single through-silicon via so that an average volume measurement may be taken of a plurality of through-silicon vias. But unlike the microfluidic measuring tool 308, the microfluidic measuring tool 312 can provide an average volume of several through-silicon vias at a time, covering all the through-silicon vias in the wafer 106 simultaneously.

Figure 4:
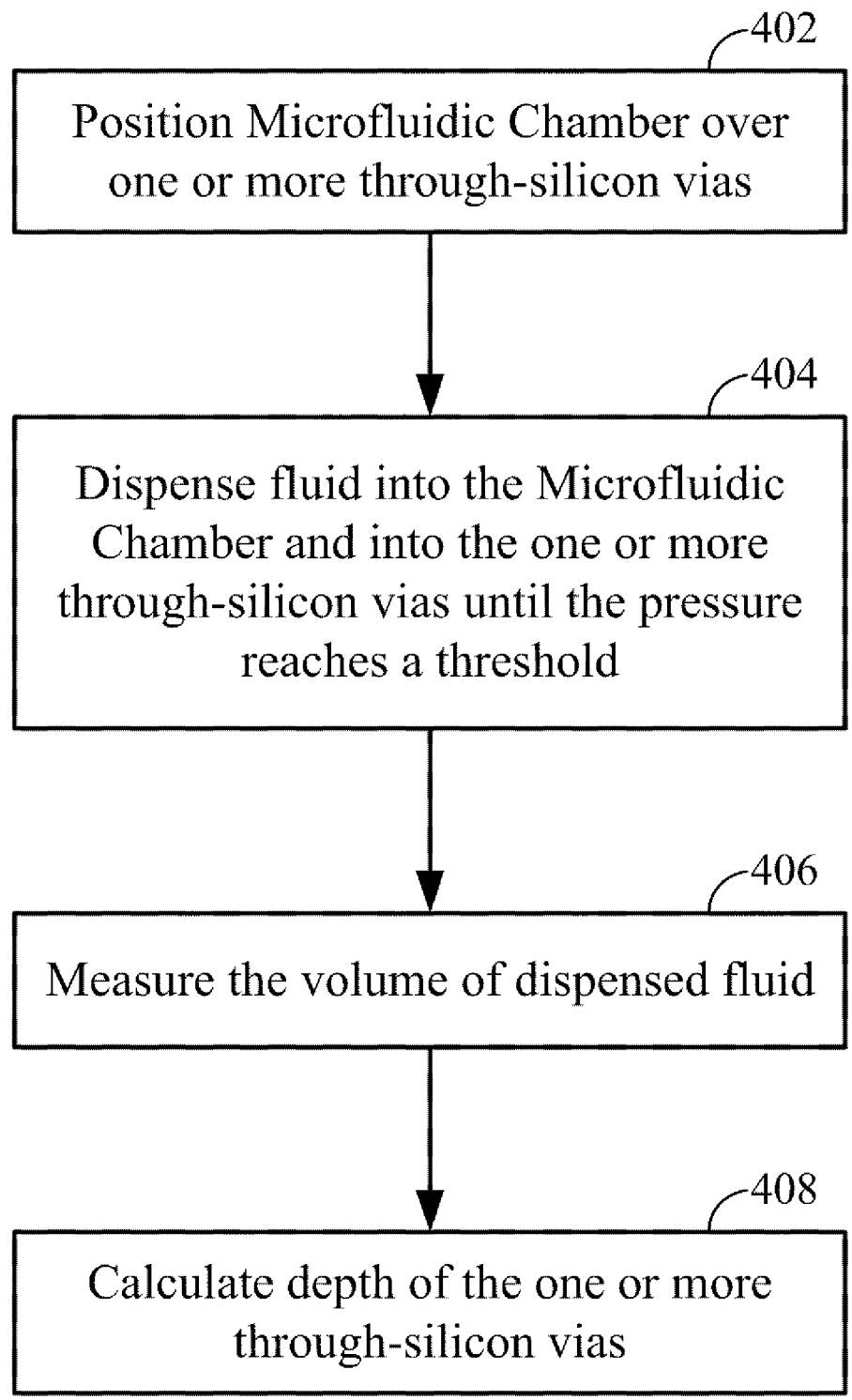
FIG. 4 is a flow diagram illustrating a method to measure the depth of one or more through-silicon vias.

A method for measuring the depth of one or more through-silicon vias is outlined in the flow diagram of FIG. 4. As discussed with respect to the previously described embodiments, the microfluidic chamber is positioned over one or more through-silicon vias so that fluid may be injected into the one or more through-silicon vias (402). Then, the fluid is dispensed into the microfluidic chamber and into the one or more through-silicon vias until the pressure of the fluid is sensed to reach some threshold (404). The volume of the dispensed fluid is then measured (406), and from this measurement the depth of the one or more through-silicon vias may be calculated (408).

Various modifications may be made to the described embodiments without departing from the scope of the invention as claimed below. For example, the substrate out of which the microfluidic measuring tool is fabricated need not be restricted to silicon. Similarly, the wafer containing the vias that are to be measured need not be restricted to silicon. Accordingly, the term through-silicon via is not meant to imply that the via is formed in a silicon wafer.

As discussed previously, for some embodiments, the fluid pressure may be sensed as to whether it meets or exceeds some threshold, which is indicative of a through-silicon via being filled completely with the fluid; or some embodiments may estimate the time derivative of the sensed pressure, where the time derivative of the sensed pressure exceeding some threshold is indicative of a through-silicon via being completely filled with the fluid. But for some embodiments, other characteristics of the fluid pressure may serve as an indicator, so that a through-silicon via is indicated as being completely filled with fluid if these characteristics (there may only be one characteristic) satisfy some criterion.

Throughout the description of the embodiments, various mathematical relationships are used to describe relationships among one or more quantities. For example, a mathematical relationship or mathematical transformation may express a relationship by which a quantity is derived from one or more other quantities by way of various mathematical operations, such as addition, subtraction, multiplication, division, etc. Or, a mathematical relationship may indicate that a quantity is larger, smaller, or equal to another quantity. These relationships and transformations are in practice not satisfied exactly, and should therefore be interpreted as "designed for" relationships and transformations. One of ordinary skill in the art may design various working embodiments to satisfy various mathematical relationships or transformations, but these relationships or transformations can only be met within the tolerances of the technology available to the practitioner.

Accordingly, in the following claims, it is to be understood that claimed mathematical relationships or transformations can in practice only be met within the tolerances or precision of the technology available to the practitioner, and that the scope of the claimed subject matter includes those embodiments that substantially satisfy the mathematical relationships or transformations so claimed.

What is claimed is:

1. A system comprising:
   a substrate;
   a microfluidic chamber formed in the substrate and having a first opening, a second opening, and a third opening;
   a fluid actuation chamber formed in the substrate and coupled to the second opening of the microfluidic chamber to inject fluid into the microfluidic chamber; and
   a pressure sensing chamber formed in the substrate and coupled to the third opening of the microfluidic chamber to sense fluid pressure.

2. The system as set forth in claim 1, further comprising:
   a wafer having a via, wherein the first opening of the microfluidic chamber is positioned over the via and the substrate is in contact with the wafer.

3. The system as set forth in claim 2, further comprising:
   a diaphragm formed in the fluid actuation chamber to force fluid into the microfluidic chamber.

4. The system as set forth in claim 3, further comprising:
   a diaphragm formed in the pressure sensing chamber to sense fluid pressure.

5. The system as set forth in claim 1, further comprising:
   a diaphragm formed in the fluid actuation chamber to force fluid into the microfluidic chamber.

6. The system as set forth in claim 5, further comprising:
   a diaphragm formed in the pressure sensing chamber to sense fluid pressure.

7. The system as set forth in claim 1, wherein the substrate comprises silicon.

8. The system as set forth in claim 1, wherein the substrate comprises silicon.

9. A tool comprising a substrate, the substrate comprising:
   a microfluidic chamber having an opening;
   a fluid actuation chamber coupled to the microfluidic chamber to inject fluid into the microfluidic chamber; and
   a pressure sensing chamber coupled to the microfluidic chamber to sense fluid pressure.

10. The tool as set forth in claim 9, the fluid actuation chamber comprising a diaphragm to measure the volume of injected fluid.

11. The tool as set forth in claim 10, the pressure sensing chamber comprising a diaphragm to sense fluid pressure.

12. A method to measure the volume of a fluid injected into one or more vias, wherein the one or more vias are in a wafer, the method comprising:
   placing the opening of a microfluidic chamber over the one or more vias;
   injecting the fluid into the microfluidic chamber and the one or more vias;
   sensing the pressure of the fluid in the microfluidic chamber; and
   measuring the volume of the fluid injected into the microfluidic chamber and the one or more vias when one or more characteristics of the sensed pressure satisfy a criterion.

13. The method as set forth in claim 12, wherein the one or more characteristics of the sensed pressure satisfy the criterion when the sensed pressure meets or exceeds a threshold.

14. The method as set forth in claim 12, wherein the one or more characteristics of the sensed pressure satisfy the criterion when an estimate of the time derivative of the sensed pressure meets or exceeds a threshold.

15. A system comprising:
   a substrate;
   a microfluidic chamber formed in the substrate and having a first opening, a second opening, and a third opening;

a means for injecting fluid into the microfluidic chamber, formed in the substrate and coupled to the second opening of the microfluidic chamber; and a means for sensing pressure, formed in the substrate and coupled to the third opening of the microfluidic chamber.

16. The system as set forth in claim 15, further comprising:

a wafer having a via, wherein the first opening of the microfluidic chamber is positioned over the via and the substrate is in contact with the wafer.

* * * * *